US006501322B1

(12) United States Patent
Bidenbach et al.

(10) Patent No.: US 6,501,322 B1
(45) Date of Patent: Dec. 31, 2002

(54) ANALOG INTEGRATOR CIRCUIT

(75) Inventors: Reiner Bidenbach, Vörstetten (DE); Ulrich Theus, Gundelfingen (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 09/611,599

(22) Filed: Jul. 7, 2000

(30) Foreign Application Priority Data

Jul. 9, 1999 (DE) ........................................ 199 31 879

(51) Int. Cl.[7] ................................................ H03K 17/92
(52) U.S. Cl. ........................ 327/336; 327/337; 327/344
(58) Field of Search ................................ 327/336, 337, 327/344, 345; 323/284; 575/376

(56) References Cited

U.S. PATENT DOCUMENTS

| | | | | |
|---|---|---|---|---|
| 3,902,139 A | * | 8/1975 | Harrell | 331/108 D |
| 4,893,193 A | | 1/1990 | Nakamura et al. | 358/341 |
| 5,138,204 A | * | 8/1992 | Imamura et al. | 327/263 |
| 5,237,460 A | | 8/1993 | Miller et al. | 360/8 |
| 5,473,326 A | | 12/1995 | Harrington et al. | 341/51 |
| 5,490,260 A | | 2/1996 | Miller et al. | 395/427 |
| 5,627,995 A | | 5/1997 | Miller et al. | 395/497.02 |
| 5,727,037 A | * | 3/1998 | Maneatis | 375/376 |
| 5,832,085 A | | 11/1998 | Inoue et al. | 380/10 |
| 5,949,225 A | * | 9/1999 | Sawtell | 323/284 |
| 6,160,435 A | * | 12/2000 | Kim | 327/336 |

FOREIGN PATENT DOCUMENTS

| | | |
|---|---|---|
| DE | 27 32 298 A1 | 2/1979 |

* cited by examiner

*Primary Examiner*—My-Trang Nuton
*Assistant Examiner*—Hiep Nguyen
(74) *Attorney, Agent, or Firm*—Samuels, Gauthier & Stevens, LLP

(57) ABSTRACT

In integrators which integrate the analog photocurrent of a photodiode (PD), the amplification-bandwidth product is relatively small on account of the parallel parasitic capacitance (Cp) of the photodiode (PD). However, in a design with a switched capacitor (C1), the bandwidth and at the same time the DC amplification must be large, so as to assure the integrator function even at low frequencies. So as to fulfill both of these mutually contradictory requirements for large bandwidth and high DC amplification, a reference voltage (V1) is present at a voltage divider that includes a resistor (R2) and a circuit section (R1) connected in series thereto, as well as at the photodiode (PD). The connection point of the voltage divider is connected to the inverting input of the transconductance amplifier (V). In a preferred embodiment, the circuit section (R1) is realized as a switched capacitor (C1), and the resistance (R2) is realized as an MOS transistor (T1). As an integrated switching circuit, the invention is especially suited for sigma-delta-analog converters.

3 Claims, 3 Drawing Sheets

ANALOG INTEGRATOR CIRCUIT

BACKGROUND OF THE INVENTION

The invention relates to the field of analog circuits, and in particular to the field of analog integrator circuits, suitable for use for example with an analog-to-digital converter (ADC).

FIGS. 4 and 5 illustrate analog integrator circuits suitable for use with an ADC. The integrator circuit illustrated in FIG. 4 includes a transconductance amplifier V, whose output is fed back via an integration capacitor Ci to its inverting input. A reference voltage V2 is applied to the non-inverting input of the amplifier V. A reference voltage V1 is applied to a series circuit consisting of an adjustable resistor R1 and a current source Q1 with a parallel parasitic capacitor Cp. The common connection point of the adjustable resistor R1 and the current source Q1 is connected to the inverting input of the transconductance amplifier V.

FIG. 5 illustrates an integrator in which the adjustable resistor is realized as a switched capacitor C1. This integrator therefore can be integrated in a space-saving manner.

The integrator circuits illustrated in FIGS. 4 and 5 are used, for example, in ADCs. The adjustable resistor R1 and the switched capacitor C1 are adjusted, depending on the voltage Vo at the output of the transconductance amplifier, in such a way that the current flowing through the adjustable resistor takes up the input current from the current source.

A problem with conventional analog integrator circuits occurs when the parasitic parallel input capacitance is large. For example, referring still to FIGS. 4 and 5, if the device providing the input signal to the ADC is a integrated photodiode PD, the photodiode PD generally has a relatively high parasitic parallel input capacitance Cp. As a consequence of the large parallel parasitic capacitance Cp and low input current, the ratio of the parallel parasitic capacitance Cp to the integration capacitance Ci (i.e., Cp/Ci) is about one-hundred. As a result, the amplification-bandwidth product is undesirably reduced by about two orders of magnitude.

When using a switched capacitance as the adjustable resistance, the bandwidth should be large enough, while at the same time the DC amplification likewise should be large, in order to ensure that the integrator circuit functions even at low frequencies. However, because these two requirements are contradictory, a compromise between them is necessary in order to achieve an acceptable bandwidth and an acceptable DC amplification.

Therefore, there is a need for an analog integrator circuit that provides the requisite bandwidth and DC amplification.

SUMMARY OF THE INVENTION

Briefly, according to the present invention, a voltage divider that includes a first and a second resistor and a current source with the parallel parasitic capacitance that together provide a second reference voltage. The connection point of the first and of the second resistor is connected to the inverting input of a transconductance amplifier.

The second resistor, which does not exist in the prior art, is dimensioned such that the ratios of the feedback network $$\frac{j\omega Ci}{(R2 + j\omega Cp)}$$

are changed in such a way that a much higher amplification-bandwidth product is achieved.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
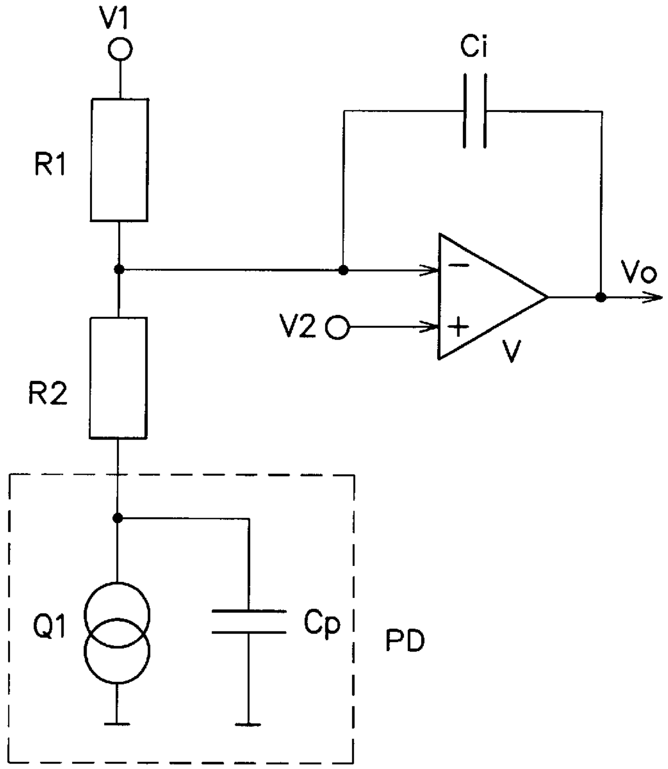
FIG. 1 illustrates a first embodiment of the invention.

FIG. 1 illustrates an analog integrator circuit. The circuit includes a transconductance amplifier V that provides an output voltage Vo, which is connected via an integration capacitor Ci, to its inverting input. Resistors R1 and R2 together with a series-connected current source Q1 with a parallel parasitic capacitor Cp, form a voltage divider. The common connection point of these two resistors R1 and R2 is likewise connected to the inverting input of the transconductance amplifier V. A reference voltage V1 is present at the ends of the voltage divider formed by the series circuit including the resistors R1 and R2 as well as the current source Q1. A reference voltage V2 is applied to at the non-inverting input of the transconductance amplifier V. The additional resistor R2 makes it possible to achieve a much higher amplification-bandwidth product, if the resistor R2 is appropriately dimensioned. The additional resistor R2 acts as a decoupling resistor.

The resistor R2 is dimensioned at least as large as the amplification-bandwidth product multiplied by the capacitance of the integration capacitor Ci. The formula for this reads as follows:

$$R \geqq 2\pi fCi$$

where

Ci=the capacitance of the integration capacitor, f=bandwidth (e.g., 10 MHz).

If the integration capacitor Ci has a capacitance of about $30\times10^{-15}$ F, the resulting resistance of the resistor R2 is about 450 kΩ, assuming a 10 MHz bandwidth. Resistance R2 will suitably be dimensioned somewhat larger.

Figure 2:
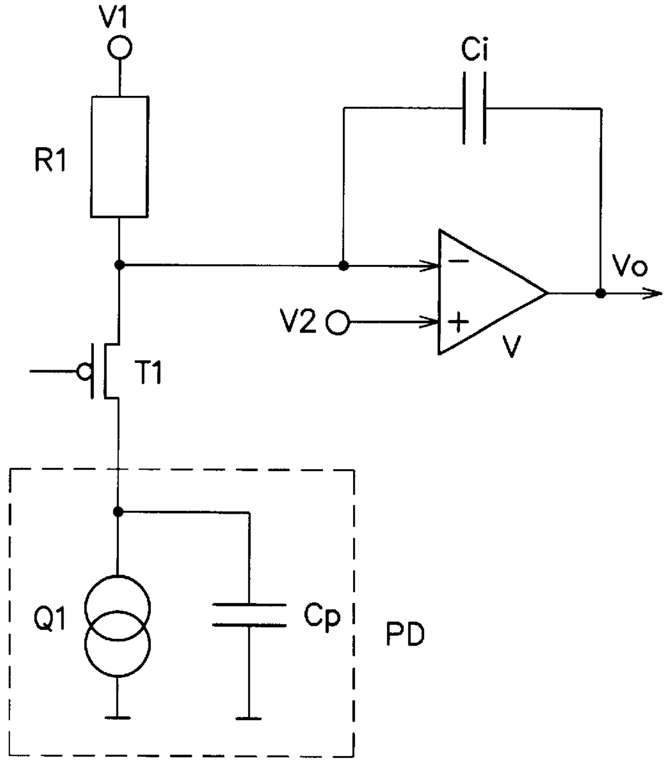
FIG. 2 illustrates a second embodiment of the invention.

FIG. 2 illustrates a second embodiment of the invention, which differs from the first embodiment shown in FIG. 1 in that the additional resistor R2 is replaced by an MOS transistor T1. The MOS transistor operates in the region of weak inversion. For this purpose, a voltage is applied to the gate electrode of the MOS transistor T1 which is chosen to be lower than the reference voltage V2, in accordance with relationship that:

$$Vg > V2 + Vth$$

where $V_G$ is the gate voltage at the transistor T1 and $V_{TH}$ is the threshold voltage of the transistor T1.

In embodiments illustrated in FIGS. 1 and 2, the resistor R1 can be replaced by a switchable capacitor.

Figure 3:
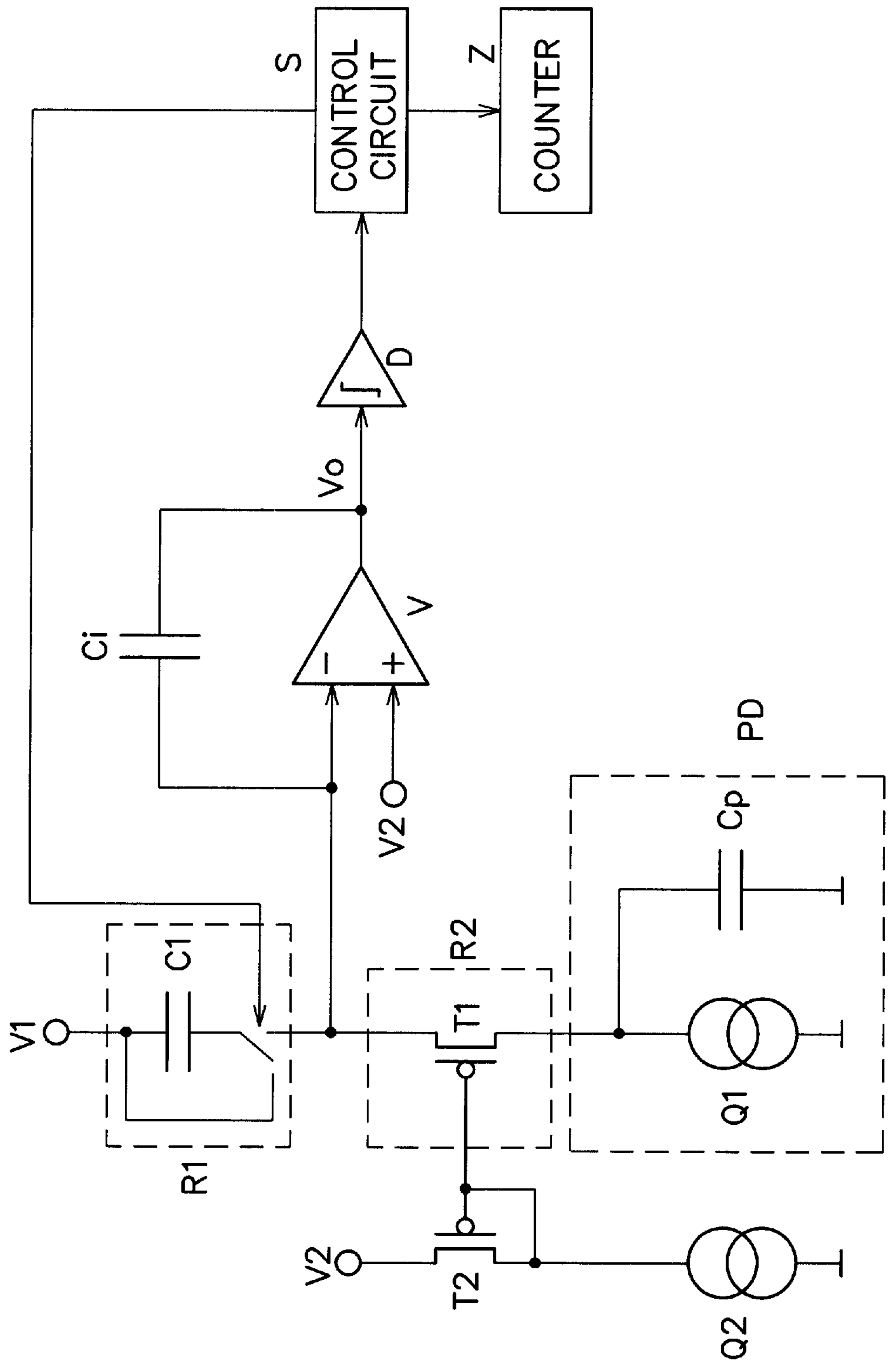
FIG. 3 illustrates the application of the invention in a measurement converter.
Figure 4:
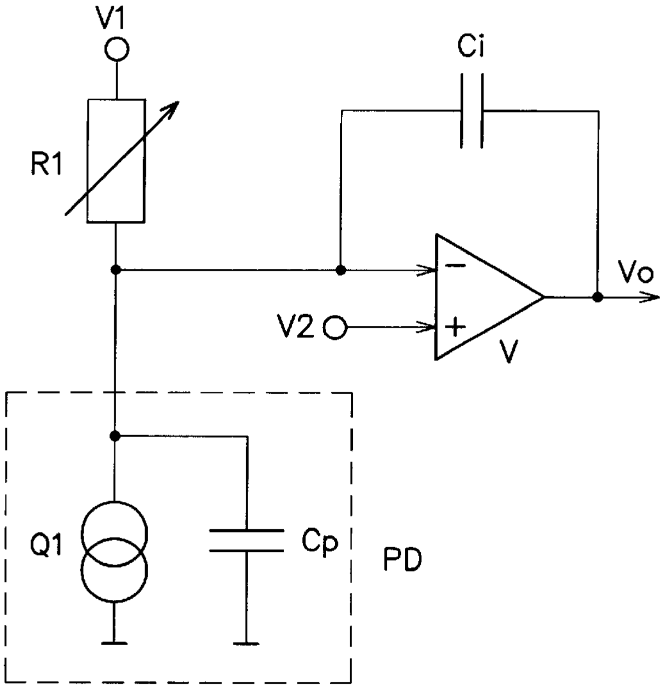
FIG. 4 (PRIOR ART)
FIG. 4 illustrates a first embodiment of a prior art analog integrator circuit.
Figure 5:
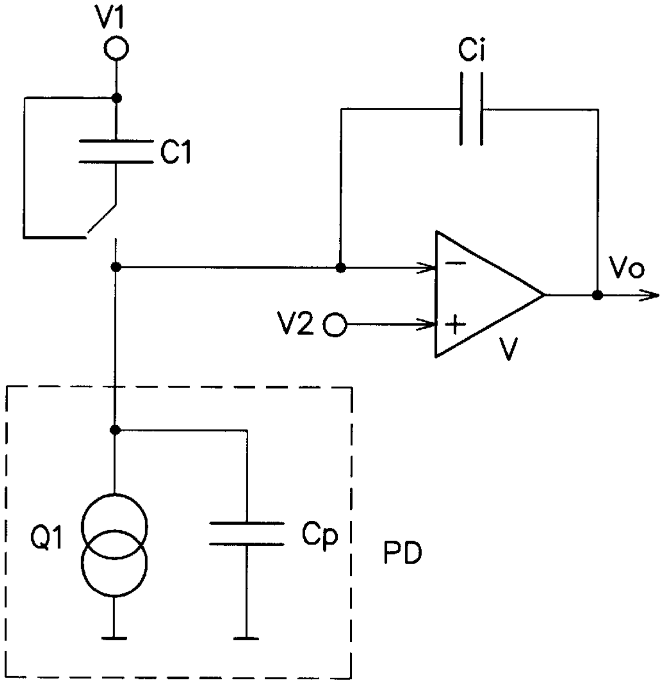
FIG. 5 (PRIOR ART)
FIG. 5 illustrates a second embodiment of a prior art analog integrator circuit.

The example shown in FIG. 3 is a first-order sigma-delta-analog-digital converter. As a measurement converter with a photodiode input, it converts analog optical signals into digital electrical signals.

The output of the transconductance amplifier V, from which the output voltage Vo can be tapped, is connected via the integration capacitor Ci, to its inverting input. A reference voltage V2 is present at the non-inverting input of the transconductance amplifier V. A voltage divider is constructed as a series circuit that includes a switched capacitor C1, the source-drain section of a MOS transistor T1 and a photodiode PD. A reference voltage V1 is present at the two ends of this voltage divider. The source of the MOS transistor T1 is connected to the inverting input of the transconductance amplifier V, whose output is connected to the input of a threshold detector D. The gate electrode of the MOS transistor T1 is connected to the gate electrode and the drain electrode of an MOS transistor T2. A reference voltage V2 is present at the source of the MOS transistor T2, while the collector of the MOS transistor T2 is connected via a current source Q2 to a reference potential. The output of the threshold detector D is connected to the input of a control circuit S, whose first output is connected to the input of a counter Z, and whose second output is connected to the switching input on the switched capacitor C1. The photodiode PD is represented by its equivalent circuit diagram, which is drawn as a current source Q1 with a parallel parasitic capacitor Cp, whose capacitance is of the order of $3\times10^{-12}$ F. Furthermore, it is suitable to choose a capacitance of for example about $30\times10^{-15}$ F for the integration capacitor Ci. This value depends on the capacitance of the capacitor C1, and the latter again depends on the photocurrent and on the resolution of the A/D converter.

The control circuit S controls the switched capacitance C1 as well as the counting state of the counter Z, in dependence on the voltage Vo at the output of the transconductance amplifier V.

Referring still to FIG. 3, the transistor T1, acting as an ohmic resistor R2, is connected in series with a switched capacitor C1, but the invention is not restricted to this. Rather, the switched capacitor C1 can also be realized by a switched current source, a switched resistor, or a resistor itself. Within the meaning of the invention described above, an "ohmic device" always is to be understood as the series circuit of an ohmic resistance (R2 or T1) and another circuit section, which can be an ohmic resistor R2, a switched capacitor C1, or a switched current source.

The invention is suitable for integrators which obtain their input signal from an analog signal source with a relatively high parallel parasitic capacitance. It is therefore especially suited for sigma-delta-analog-digital converters, which often are also called delta-sigma-analog-digital converters, and whose input signals are typically delivered by a photodiode.

Sigma-delta-analog-digital converters are described, for example, in Herbert Bernstein, Analog Circuit Technology with Discrete and Integrated Components, Hüthig publishing company, Heidelberg, 1997 (ISBN 3-7785-2296-5) on pages 480 through 485, and in David A. Jons, Ken Martin, Analog Integrated Circuit Design, John Wiley and Sons, New York, Toronto, 1997 (ISBN 0-471-14448-7) on pages 531 through 551. For the purpose of this disclosure, reference is made to the full content of these publications, which are hereby incorporated by reference.

Although the present invention has been shown and described with respect to several preferred embodiments thereof, various changes, omissions and additions to the form and detail thereof, may be made therein, without departing from the spirit and scope of the invention.

What is claimed is:

1. An integrator, comprising:

a transconductance amplifier (V), whose output is fed back, via an integration capacitor (Ci), to its inverting input, and at whose non-inverting input a first reference voltage (V2) is present; and a first current source (Q1), which contains a parallel parasitic capacitor (Cp), and one of whose terminals is connected to a reference potential, and whose other terminal is connected, via impedance device, to a second reference voltage (V1), characterized in that the impedance device is a voltage divider with a resistor (R2) and another circuit section (R1) comprising one of a switched capacitor and a switched resistor, and that the connection point of the resistor (R2) and of the circuit section (R1) is connected to the inverting input of the transconductance amplifier (V), wherein the resistor (R2) is replaced by a first MOS transistor (T1), which operates in the region of weak inversion, and a gate electrode of the first MOS transistor (T1) is connected to a gate electrode and a drain electrode of a second MOS transistor (T2), at whose source the first reference voltage (V2) is present, and whose drain is connected, via a second current source (Q2), to a reference potential, and that the output of the transconductance amplifier (V) is connected to the input of a threshold detector (D), whose output is connected to the input of a control circuit (S), whose first output is connected to the input of a counter (Z), and whose second output is connected to the control input of the switched capacitor (C1) or to the switched resistor.

2. An integrator that is configured and arranged on an integrated circuit for use with an analog-to-digital converter, and receives an input signal from a photodiode having a first terminal connected to a reference potential and a second terminal, said integrator comprising:

an amplifier having an inverting input and a non-inverting input, that provides an output signal that is fed back via a capacitor to said inverting input, and whose said non-inverting input is maintained at a first reference voltage; and an impedance device having a first ohmic device lead that is connected to the second terminal and a second impedance device lead that is connected to a second reference voltage, wherein said impedance device includes a voltage divider comprising (i) a resistive device and (ii) a circuit section connected electrically in series, and that the connection point of said resistive device and said circuit section is connected to said inverting input of said amplifier, wherein said circuit section comprises a switched capacitor circuit.

3. An integrator that is configured and arranged on an integrated circuit for use with an analog-to-digital converter, and receives an input signal from a photodiode having a first terminal connected to a reference potential and a second terminal, said integrator comprising:

an amplifier having an inverting input and a non-inverting input, that provides an output signal that is fed back via a capacitor to said inverting input, and whose said non-inverting input is maintained at a first reference voltage; and an impedance device having a first ohmic device lead that is connected to the second terminal and a second impedance device lead that is connected to a second reference voltage, wherein said impedance device includes a voltage divider comprising (i) a resistive device and (ii) a circuit section connected electrically in series, and that the connection point of said resistive device and said circuit section is connected to said inverting input of said amplifier, wherein said circuit section comprises a switched current source.

* * * * *